United States Patent
Bhaskar et al.

(10) Patent No.: US 9,716,734 B2
(45) Date of Patent: Jul. 25, 2017

(54) SYSTEM AND METHOD FOR LONG RANGE AND SHORT RANGE DATA COMPRESSION

(71) Applicant: Hughes Network Systems, LLC, Germantown, MD (US)

(72) Inventors: Udaya Bhaskar, North Potomac, MD (US); Chi-Jiun Su, Rockville, MD (US)

(73) Assignee: Hughes Network Systems, LLC, Germantown, MD (US)

(*) Notice: Subject to any disclaimer, the term of this patent is extended or adjusted under 35 U.S.C. 154(b) by 233 days.

(21) Appl. No.: 14/301,295

(22) Filed: Jun. 10, 2014

(65) Prior Publication Data

US 2014/0325088 A1 Oct. 30, 2014

Related U.S. Application Data

(63) Continuation of application No. 13/180,969, filed on Jul. 12, 2011, now abandoned.

(51) Int. Cl.
| | |
|---|---|
| *G06F 5/00* | (2006.01) |
| *H04L 29/06* | (2006.01) |
| *H03M 7/30* | (2006.01) |
| *H03M 7/40* | (2006.01) |

(52) U.S. Cl.
CPC .......... *H04L 65/60* (2013.01); *H03M 7/3088* (2013.01); *H03M 7/4006* (2013.01); *H04L 69/04* (2013.01)

(58) Field of Classification Search
None
See application file for complete search history.

(56) References Cited

U.S. PATENT DOCUMENTS

| | | |
|---|---|---|
| 4,814,746 A | 3/1989 | Miller et al. |
| 5,166,987 A | 11/1992 | Kageyama |
| 5,426,779 A | 6/1995 | Chambers |
| 5,627,534 A | 5/1997 | Craft |

(Continued)

OTHER PUBLICATIONS

Bar-Ness, et al., "String Dictionary Structure for Markov Arithmetic Encoding", IEEE International Conference on Communications, 1988, XP002672031, 1988.

(Continued)

*Primary Examiner* — David H Malzahn
(74) *Attorney, Agent, or Firm* — Potomac Technology Law, LLC

(57) ABSTRACT

A system and method are provided for use with streaming blocks of data, each of the streaming blocks of data including a number bits of data. The system includes a first compressor and a second compressor. The first compressor can receive and store a number n blocks of the streaming blocks of data, can receive and store a block of data to be compressed of the streaming blocks of data, can compress consecutive bits within the block of data to be compressed based on the n blocks of the streaming blocks of data, can output a match descriptor and a literal segment. The match descriptor is based on the compressed consecutive bits. The literal segment is based on a remainder of the number of bits of the data to be compressed not including the consecutive bits. The second compressor can compress the literal segment and can output a compressed data block including the match descriptor and a compressed string of data based on the compressed literal segment.

20 Claims, 5 Drawing Sheets

(56) References Cited

U.S. PATENT DOCUMENTS

| | | | |
|---|---|---|---|
| 6,032,113 A | 2/2000 | Graupe | |
| 6,624,762 B1 | 9/2003 | End | |
| RE41,152 E | 2/2010 | Reynar et al. | |
| 7,840,744 B2 | 11/2010 | Bellows et al. | |
| 9,363,339 B2 | 6/2016 | Bhaskar et al. | |
| 2009/0006510 A1 | 1/2009 | Laker et al. | |
| 2009/0060047 A1 | 3/2009 | Schneider | |
| 2013/0018932 A1 | 1/2013 | Bhaskar et al. | |
| 2014/0223029 A1 | 8/2014 | Bhaskar et al. | |
| 2014/0223030 A1* | 8/2014 | Bhaskar | H03M 7/3088 709/247 |

OTHER PUBLICATIONS

EPO App. No. 11178082.1 "European Search Report", Jan. 16, 2013.
Williams, "LZRW3-A.C", XP002672032, http://www.ross.net/compression/download/original/old_lzrw3-a.c, Aug. 2, 1991, 1-13.
Williams, "Notes From the Comp. Compression FAQ", XP002672021, http://www.ross.net/compression/patents_notes_from_ccfaq.html, Mar. 21, 1996.
Yang, et al., "Efficient Universal Lossless Data Compression Algorithms Based on a Greedy Sequential Grammar Transform—Part One: Without Context Models", IEEE Transactions on Information Theory, vol. 46, No. 3, May 1, 2000, XP011027647, May 1, 2000.

\* cited by examiner

SYSTEM AND METHOD FOR LONG RANGE AND SHORT RANGE DATA COMPRESSION

RELATED APPLICATIONS

This application is a Continuation of co-pending U.S. patent application Ser. No. 13/180,969 (filed Jul. 12, 2011), the entirety of which is incorporated herein by reference.

BACKGROUND

The present invention pertains to the field of data compression techniques, in particular, lossless data compression techniques for efficient transmission of internet traffic over data communications links such as, satellite, terrestrial wireless or wired links.

Analysis of internet traffic reveals that for certain content types, which constitute a significant portion of the total traffic, a high degree of redundancy exists in the transmitted data. This manifests itself in the form of macro redundancies and micro redundancies. Macro redundancies are basically duplications of long byte strings, which occur when the same or similar data entities, (typically comprising hundreds of bytes or more) are repeatedly transmitted on a link between two end points. Micro redundancies occur due to the fine grain syntax underlying the byte sequences, which imposes a structure so that some smaller byte patterns (typically a few bytes in length) occur more frequently than others. Both of these types of redundancies must be fully exploited by lossless data compression techniques to transmit the data most efficiently. The benefit is conservation of communication link resources (such as channel bandwidth and power) as well as improvement in user experience due to lower latency and faster response time.

Redundancies in the data stream can appear at many levels. At the highest level, an entire web page or a document, which was previously transmitted may be retransmitted on the data stream (for example, due to user repeating the request for such an entity); at a lower level, an object within a web page (such as an image belonging to an advertisement in a web page) may be frequently retransmitted, because it is common across multiple popular web pages; or at the lowest level, a byte segment which was previously transmitted may reappear on the data stream. Each of these redundancies can be exploited by preventing the retransmission of the duplicate data, provided appropriate memory and processing techniques are employed at both ends of the connection.

The range (i.e., the separation in terms of the number of transmitted bytes from an occurrence of a byte segment to its redundant occurrence), over which redundancies occur in the data stream, can span from a few bytes to several tens or hundreds of megabytes. It is dependent on several factors such as the type of content, speed of the link, usage pattern of the user, the number of users attached to the end point etc. Moreover, the redundancies can be micro redundancies, where the duplications are only a few bytes long or much longer macro redundancies.

Some of the common techniques for internet data compression belong to the Lempel-Ziv family of compressors (LZ77, LZ78 or its derivatives such as gzip, compress, or Hughes V.44), or more recently grammar transform based compressors (for example, the Hughes Network Systems Inc., YK Compressor). The problem with these compression techniques is that they become overly complex and impractical (for stream data compression applications) when their dictionary, grammar, or history window size is increased significantly. These techniques can only use data within a relatively short history window (or equivalently, a small dictionary or grammar) that ranges from a few tens of kilobytes to a few megabytes in size. This means that these techniques are only capable of exploiting redundancies within a relatively small span of consecutive bytes, or a "window," that ranges from a few tens to a few kilobytes to a few megabytes. Since internet web traffic exhibits redundancies across tens of megabytes or more, these techniques cannot be directly used to translate such long range redundancies into compression gain.

Another important limitation of these techniques is that they cannot compress entities that have already been compressed at the source. For example, an embedded image in a web page is typically compressed (as a GIF, PNG or JPEG object). These techniques cannot compress such compressed objects. If such objects are processed by these techniques it may actually increase the size of the object, which is undesirable.

A further disadvantage of the LZ family of compressors is that they are inherently ill-suited for using arithmetic coding for entropy coding of the LZ compressor tokens in a manner that fully exploits the optimality of arithmetic coding. It is well known that arithmetic coding is the most efficient form of entropy coder. Consequently, the performance of this type of coders is in general suboptimal. However, grammar-based compressors do not possess this short coming. In fact, the combination of a grammar transform and arithmetic coding (i.e., grammar-based compressor) has been shown to outperform the LZ77 and LZ78 compressors. Grammar-based compressors and grammar-based decompressors are described in U.S. Pat. No. 6,400,289 B1, Jun. 4, 2002, and U.S. Pat. No. 6,492,917 B1, Dec. 10, 2002, the entire contents of which are incorporated herein by reference.

What is needed is a technique for lossless data compression to improve the efficiency of the transmission of internet traffic over communication links such as, satellite or terrestrial links by having the capability of compressing entities that have already been compressed at the source, given sufficient compressor memory (cache size).

BRIEF SUMMARY

The present invention provides a system and method for efficient transmission of internet traffic over communications links, using a data compression technique consisting of a first stage of long range compressor front end and a second stage of short range compressor back end.

A block may be considered a string of bytes that a compressor is able to receive at approximately the same time. For example, a relatively small compressor may be able to receive 8 bytes at one time, whereas a relatively large compressor may be able to receive $10^3$ bytes. In other words, a block may be defined by the capacity of the compressor.

For purposes of discussion, consider a non-limiting example application wherein web-browsing data is to be compressed. A webpage consists of web objects, including a picture object, a sound object, a text object, etc. When transmitting webpage data, a transmitting entity works in conjunction with a compressor, wherein the transmitting entity knows the capacity of the compressor. Now, suppose that a compressor has a 10-kilobyte capacity. Further, suppose that a picture object of the webpage is 1-megabyte. In this situation, the transmitting entity may break up the 1-megabyte picture object into 100 10-kilobyte objects, which will be streamed into the compressor. As such, in this example, a block will be 10 kilobytes.

In accordance with an aspect of the present invention, a system and method are provided for use with streaming blocks of data, each of the streaming data blocks including a number of bits of data. The system includes a first compressor and a second compressor. The first compressor can receive and store a number n blocks of the streaming data blocks, can receive and store a block of data to be compressed of the streaming data blocks, can compress consecutive bits within the block of data to be compressed based on the n blocks of the streaming blocks of data, can output a match descriptor and a literal segment. The match descriptor is based on the compressed consecutive bits. The literal segment is based on a remainder of the number of bits of the data to be compressed not including the consecutive bits. The second compressor can compress the literal segment and can output a compressed data block including the match descriptor and a compressed string of data based on the compressed literal segment.

Additional advantages and novel features of the invention are set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings.

DETAILED DESCRIPTION

Figure 1:
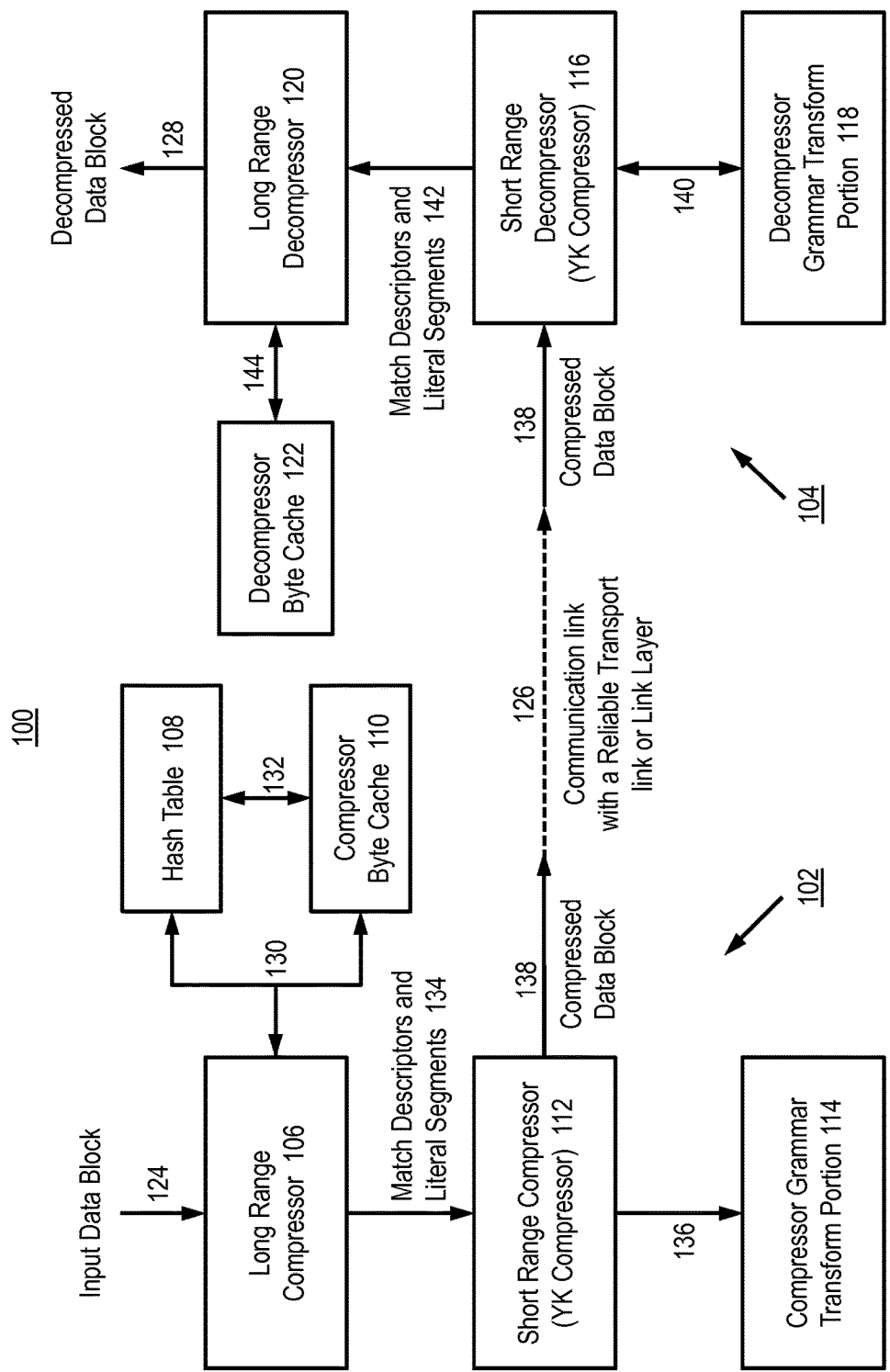
FIG. 1 illustrates a communication system in accordance with an aspect of the present invention.

Aspects of the present invention provide a lossless data compression technique including a first stage having a long range compressor front end and a second stage having a short range compressor back end. A long range compressor retains a "long range" of previously received bytes in an input byte stream for compression and captures macro redundancies in the input byte stream. For example, a long range compressor may store copies of the last 109 bytes of data that had streamed. As such a current byte of data may be compared with all of the stored 109 bytes for any similar bit sequences (redundancies). The main role of this stage is to provide the compressor access to a large history of past transmitted data (i.e., a large memory buffer of several tens or hundreds of megabytes), while minimizing the processing complexity needed to process the large amount of stored data. The advantage of this stage is that macro redundancies as seen within a long history of the input byte stream can be captured with very modest processing resources.

The first stage having a long range compressor front end is followed by a second stage having a short range compressor back end. In one embodiment of the present invention, a grammar-based compressor, which uses a sophisticated grammar transform and adaptive arithmetic coding, is used. However, any short range compressor may be used.

The main role of the second stage is to exploit any residual or micro redundancies in the output of the first stage. In example embodiments, the second stage applies a much more powerful compression technique than the first stage. Since the first stage has already eliminated long range redundancies, the second stage can operate with a smaller history (i.e., less data to be processed), with no loss in performance. In particular, a short range compressor retains a "short range" of previously received bytes in an input byte stream for compression and captures micro redundancies in the input byte stream. For example, a long range compressor may store copies of the last 109 bytes of data that had streamed. As such a current byte of data may be compared with all of the stored 109 bytes for any similar bit sequences (redundancies). In other words, the short range compressor uses a smaller amount of received bytes than the long range compressor to determine redundancies. This allows the use of far more powerful techniques than the first stage, and the combination of the two stages delivers near optimal compression gain. The grammar transform and adaptive arithmetic coder used by the second stage are keys to its performance. The strategy of capturing the long range macro redundancies by a simpler computation efficient first stage, allows a more sophisticated second stage in order to capture the more complex structural micro redundancies. This reduces the complexity of the overall scheme to a reasonable level, while achieving near optimal compression gains.

In order to fully appreciate the benefits of aspects of the present invention the differences between a non-streaming mode compression scheme and a streaming mode compression scheme should be discussed.

In a non-streaming mode compression scheme, compression is based only on the current input block of data and after the current block has been compressed, and the compressor state is reinitialized (i.e., history buffer is cleared). In the non-streaming mode compression scheme, only redundancy within an input block can be compressed. As such, the history of previous blocks cannot be used for compressing future blocks.

Consider for example the non-streaming mode compression scheme of conventional file compressors. With conventional file compressors, if two identical files are input into the compressor, one after another, the history of the first file will have already been forgotten when the second file is input. As a result, the overall compressed size is 2× the compressed size of one file. If the conventional file compressor is used in a streaming mode, the overall compressed size will be the compressed size of one file plus a small number of bytes.

In a streaming mode compression scheme, in accordance with aspects of the present invention, compression is based on not only on the redundancy within the current input block in process but also on the redundancy of the blocks that have been processed in the past. The compressor history is dynamic and "live," wherein only the size of the allocated history buffer limits how many blocks the compressor can remember (can make use of). Due to its dynamic memory about the past, a streaming mode compression scheme in accordance with aspects of the present invention provides significantly better compression gain than a non-streaming mode compression scheme. The extent of gain depends on the number of redundancies present in the data and the size of the allocated history buffer. In particular, if most of the redundancies exist among a long range of input blocks, streaming mode compression scheme in accordance with aspects of the present invention will provide a far more efficient compression than that of the non-streaming mode compression scheme.

The present invention provides a system and method for compressing a stream of blocks of data in a first compression stage, compressing the compressed stream of blocks in a second compression stage, transmitting the two-stage compressed stream of blocks, decompressing the two-stage compressed data in a first decompression stage and decompressing the decompressed stream of blocks in a second decompression stage.

In an example embodiment, a system is provided for use with streaming blocks of data, wherein each of the streaming blocks of data includes a number of bits of data. The system includes a first compressor and a second compressor.

The first compressor can receive and store a first portion of the streaming blocks. For purposes of discussion, presume that the first compressor receives and stores a number n blocks of the streaming blocks of data. Then, the first compressor receives and stores a block of data to be compressed. The compressor is operable to compress consecutive bits within the block of data to be compressed based on the n blocks of the streaming blocks of data.

The first compressor can output a match descriptor and a literal segment.

A match descriptor is based on the compressed consecutive bits. For example, for purposes of discussion, presume that only a portion of the block of data (string of consecutive bits) to be compressed is the same as a portion (string of consecutive bits) of the first received block—the first block of the previous n blocks of the streaming blocks of data. In this case, a match descriptor may be used to identify or point to the location of the similar portion (the location of the string of consecutive bits) in the first block of the previous n blocks of the streaming blocks of data. By providing merely a match descriptor, as opposed to the portion of the block that is similar to the first block (the actual string of consecutive bits), the overall data size is decreased.

The literal segment is based on a remainder of the number of bits of the data to be compressed not including the consecutive bits. For example, as discussed above, presume that only a portion of the block of data (string of consecutive bits) to be compressed is the same as a portion (string of consecutive bits) of the first received block—the first block of the previous n blocks of the streaming blocks of data. The remainder of the block of data to be compressed that is not the same as a portion of any of the first n received blocks are provided as a literal segment. These bits of data are "literally" the same bits of data that are input into the system.

In an example embodiment a fingerprint hash computation portion and a cache are additionally included. In this example embodiment, the first compressor additionally includes a fingerprint computation portion, a fingerprint matching portion and an output block forming portion.

The fingerprint computation portion establishes a first window in a first received block of the streaming blocks of data. The block may be in any one of the number n blocks of the streaming blocks of data. For purposes of discussion, presume that the fingerprint computation portion establishes a window of bits of data in the first block of data of the n blocks of the streaming blocks of data. The fingerprint computation portion can compute a first fingerprint based on a plurality of bits of data within the first window. A fingerprint of a data window is a string of bits that is much smaller in size than the original data in the window. Because of the much smaller size, much less processing resources are required to compare fingerprints than comparing the original data in the windows. For example, when trying to match one 210-byte data window with 25 other 210-byte data windows, a large amount of processing resources may be needed. However, if fingerprints are used, wherein for example a fingerprint may be a 25-bit entity, much less processing resources may only be required to match one 25-bit data entity with 31 other 25-bit data entities. Once a fingerprint is computed, the fingerprint computation portion can then establish a second window of the block of data to be compressed and to compute a second fingerprint based on a plurality of bits of data within the second window. The computed fingerprints for each block are stored in a hash table and are reused for detecting possible matches in future blocks.

In this example embodiment, the cache can store a first window literal segment of bits corresponding to the first window. The fingerprint hash computation portion can then create a first hash index based on the first fingerprint and can create a second hash index based on the second fingerprint.

A hash function is any well-defined procedure or mathematical function that converts a large, possibly variable-sized amount of data into a small datum, usually a single integer that may serve as an index to an array (cf. associative array). In accordance with aspects of the present invention, the values returned by a hash function are indices to a fingerprint hash table, which stores each fingerprint and its associated metadata (i.e., the location in the cache of the window from which the fingerprint was computed).

Hash functions are primarily used in hash tables, to quickly locate a data record given its search key. Specifically, accordance with aspects of the present invention, the search key is a fingerprint the hash function is used to map the search key, i.e., fingerprint, to the hash index. The index gives the place where the corresponding record should be stored. The number of possible indices is much smaller than the number of possible fingerprints. Accordingly, hash functions reduce the amount of storage area required to save fingerprints.

The fingerprint matching portion detects if a newly computed fingerprint has a match against any previously computed fingerprint (corresponding to data in the cache). This is based on the hash index of the new fingerprint. The fingerprint stored at that index of the hash table is compared to the new fingerprint. If these two fingerprints are identical, a fingerprint match has occurred. This indicates that an identical window of bits exists somewhere in the cache. The location of this identical window is provided by the metadata.

When a newly computed fingerprint is found to match a previous fingerprint for the data in the cache, the match region is expanded to the maximum possible width.

The second compressor is arranged to receive and store the match descriptor and the literal segment from the first compressor. The second compressor operates only on the literal segment and does not modify the match descriptor. The second compressor may use its own history, dictionary, grammar or any other form of internal memory of previously input literals to compress the current literal segment. Any known compression technique may be used. Finally, the second compressor outputs a compressed data block including the match descriptor, as passed directly from the first compressor, and a compressed string of data based on the compressed literal segment.

In an example embodiment, the second compressor includes a parsing portion, a grammar transform portion and an adaptive arithmetic coding portion. The parsing portion successively parses the literal segment into the longest prefixes which matches symbols in a grammar. The grammar is updated after each parsing. Each parsed symbol and information pertaining to the grammar update are passed to the adaptive arithmetic coder. The adaptive arithmetic coding portion performs entropy encoding to represent the parsed symbol and the grammar update to produce compression of the literal segment, wherein entropy encoding is a lossless data compression scheme that is independent of the specific characteristics of the medium. The compressed block output from the second compressor includes the match descriptor and the compressed literal segment.

A more detailed discussion of aspects of the present invention will now be explained with further reference to FIGS. 1-5.

FIG. 1 illustrates a communication system 100 in accordance with an aspect of the present invention.

As illustrated in FIG. 1, communication system 100 includes a compression side 102 and a decompression side 104. Compression side 102 can transmit to decompression side 104 via a communication link 126 having a reliable transport or link layer.

Compression side 102 includes a long range compressor 106, a hash table 108, a compressor byte cache 110, a short range compressor 112 and a compressor grammar transform portion 114. In this example embodiment, long range compressor 106, hash table 108, compressor byte cache 110, short range compressor 112 and compressor grammar transform portion 114 are illustrated as individual devices. However, in some embodiments of the present invention, at least two of long range compressor 106, hash table 108, compressor byte cache 110, short range compressor 112 and compressor grammar transform portion 114 may be combined as a unitary device. Further, in some embodiments, at least one of long range compressor 106, hash table 108, compressor byte cache 110, short range compressor 112 and compressor grammar transform portion 114 may be contained as a utility, program, or subprogram, in any desired tangible computer readable storage medium. In addition, the operations may be embodied by computer programs, which can exist in a variety of forms both active and inactive. For example, they may exist as software program(s) comprised of program instructions in source code, object code, executable code or other formats. Any of the above may be embodied on a tangible computer readable storage medium, which include storage devices. Exemplary tangible computer readable storage media include conventional computer system RAM, ROM, EPROM, EEPROM, and magnetic or optical disks or tapes. Concrete examples of the foregoing include distribution of the programs on a CD ROM or via Internet download. It is therefore to be understood that any electronic device capable of executing the above-described functions may perform those functions enumerated above. When information is transferred or provided over a network or another communications connection (either hardwired, wireless, or a combination of hardwired and wireless) to a computer, the computer properly views the connection as a tangible computer-readable storage medium. Thus, any such connection is properly termed a tangible computer-readable storage medium. Combinations of the above should also be included within the scope of computer-readable storage media.

Decompression side 104 includes a short range decompressor 116, a decompressor grammar transform portion 118, a long range decompressor 120 and a decompressor byte cache 122. In this example embodiment, short range decompressor 116, decompressor grammar transform portion 118, long range decompressor 120 and decompressor byte cache 122 are illustrated as individual devices. However, in some embodiments of the present invention, at least two of short range decompressor 116, decompressor grammar transform portion 118, long range decompressor 120 and decompressor byte cache 122 may be combined as a unitary device. Further, in some embodiments, at least one of short range decompressor 116, decompressor grammar transform portion 118, long range decompressor 120 and decompressor byte cache 122 may be contained as a utility, program, or subprogram, in any desired tangible computer readable storage medium. In addition, the operations may be embodied by computer programs, which can exist in a variety of forms both active and inactive.

Long range compressor 106 is arranged to receive a stream of data blocks, and example of block of a stream is indicated as an input data block 124. Input data block 124 varies in length, ranging from a few bytes to thousands of bytes, at a time. Some non-limiting examples of input data block 124 are IP blocks or web objects or any other blocks of data, which may be communicated over communication link 126. Long range compressor 106, hash table 108 and compressor byte cache 110 communicate with each other via a signal 130.

Hash table 108 receives fingerprints computed by long range compressor 106.

A hash function is used to map the fingerprint to its associated hash index. The hash index serves as an index to hash table 108, where the fingerprint and the metadata associated with that fingerprint value is stored. Hash table 108 may be implemented using any known data structure.

Compressor byte cache 110 stores the previously received data blocks within the stream of data blocks, which is checked against input data block 124 for redundancy. The fingerprint metadata stored by the hash table 108 corresponds to the location of the fingerprint data window in compressor byte cache 110. Hash table 108 and compressor byte cache 110 communicate with each other via signal 132. Compressor byte cache 110 is implemented as a contiguous circular byte buffer scheme, in accordance with an aspect of the invention, with wrap-around occurring only at block boundaries. The detail implementation of compressor byte cache 110 will be described later.

For the purposes of discussion, presume that input data block 124 contains a segment of bytes, which had occurred in at least one previously received data block of the stream of data blocks. Long range compressor 106, hash table 108 and compressor byte cache 110 work together to look for duplication of a segment of data (not necessarily the whole block), which had occurred earlier. Long range compressor 106 extracts characteristic patterns of data, also called fingerprints, from input data block 124. A hash value is computed for each fingerprint.

The computed hash value serves as an index to hash table 108, where the fingerprint and all the metadata associated with that fingerprint is stored. The metadata of a fingerprint is basically a location index to the compressor byte cache 110; it points to the location of the data (within compressor byte cache 110) from which the fingerprint had been computed. Metadata is used to map a fingerprint back to a byte sequence within compressor byte cache 110. Fingerprints are computed for each byte of incoming input data block 124. Based on a fingerprint selection process, most of the fingerprints are discarded and only few are stored. In one embodiment, fingerprints that have 'zero' in their last six least significant bits (LSB) are selected to be stored.

At a later time, if a fingerprint of input data block 124 matches with a fingerprint that is stored in hash table 108, it indicates that bytes of data of a previously received data block match bytes of data of input data block 124. In one embodiment, a fingerprint is computed over window size of data of 64 bytes. There could be a match of more than 64 bytes of data so the match region may be expanded to the left (less recently received bytes) and to the right (more recently received bytes). This will be described in greater detail below. Typically there could be thousands of matching bytes between a current data block and previous data blocks, contributing to long range compression.

A valid match indicates that a segment of bytes in input data block 124 match with a segment of bytes stored in compressor byte cache 110. Once a valid match is found, long range compression of that segment of input data block 124 may be performed.

Long range compressor 106 encodes the matched segment as a match descriptor, which contains the information about the location of the matched segment of bytes within input data block 124 and length of the matched segment. The unmatched byte segments, called literal segments, are not compressed. Long range compressor 106 provides match descriptors and literal segments to short range compressor 112 via a signal line 134.

Short range compressor 112 is operable to compress short range duplications in input data block 124, where some byte patterns occur more frequently than others. In a non-limiting example embodiment, a grammar-based compressor is illustrated but any short range compression method may be used for second stage compression.

Short range compressor 112 receives blocks that may include multiple match descriptors and literal segments via signal 134. In one embodiment, short range compressor 112 is a more compact and structured form of dictionary based compressors. Dictionary based compressors look for patterns in the byte segments and are based on the assumption that certain phrases occur more often than others.

In this non-limiting example embodiment, short range compressor 112 communicates with compressor grammar transform portion 114 via a signal 136. The literal segment is parsed into a sequence of symbols in grammar transform portion 114. Grammar within grammar transform portion 114 is updated after each parsing.

Overall, the compression processing applied to input data block 124 is determined adaptively. A given segment of input data block 124, depending on (i) the contents of compressor byte cache 110 of long range compressor 106, (ii) the grammar state of short range compressor 112 and (iii) the length of the byte segment, may be processed by long range compressor 106 followed by short range compressor 112 or it may bypass long range compressor 106 and be directly compressed by short range compressor 112. This is motivated by the observation that when compressor grammar transform portion 114 contains the variables that can compactly represent the given segment of input data block 124, short range compressor 112 is far more efficient than long range compressor 106.

Hence, whenever this condition is satisfied, it is beneficial to directly compress the given segment of input data block 124 using short range compressor 112 (i.e., by bypassing long range compressor 106). On the other hand, if compressor grammar transform portion 114 does not contain such variables, the given segment of input data block 124 is processed by long range compressor 106 followed by short range compressor 112. In this case, only the uncompressed "literal" segments in the output of long range compressor 106 are processed by short range compressor 112. This adaptive compression selection mechanism provides a higher overall compression gain than always applying long range compressor 106 followed by short range compressor 112, ignoring the input data or compressor states.

The design parameters of long range compressor 106 and short range compressor 112 are optimized jointly such that the overall compressor provides the best trade-off between the compression gain and the resources needed for the implementation of the compression, i.e., the memory capacity (RAM) and the processing (CPU) power on both the server and the client ends of the network connection. The compression gain is maximized while the complexity (i.e., storage space and processing power) are held at reasonable levels.

Short range compressor 112 provides compressed data blocks 138, which are transmitted over communication link 126 and received by short range decompressor 116. It is essential that communication link 126 provides a reliable transport or link layer to ensure that compressed data blocks 138 are delivered to short range decompressor 116 in the order of transmission and without errors or lost blocks.

Short range decompressor 116 decompresses compressed data blocks 138 received over communication link 126 and reproduces data blocks consisting of the match descriptors and literal segments. In this non-limiting example embodiment, a grammar-based decompressor is illustrated for short range decompression but any second order short range decompressor may be used.

Short range decompressor 116 communicates with decompressor grammar transform portion 118 via a signal 140. Grammar on the decompressor side needs to be updated based on the information received over communication link 126 such that it is identical to the grammar on compression side 102, in order to achieve lossless decompression. Short range decompressor 116 communicates with long range decompressor 120 via a signal 142.

Long range decompressor 120 receives match descriptors and literal segments from short range decompressor 116 and reconstructs the input data block accordingly. It communicates with decompressor byte cache 122 via a signal 144. Decompressor byte cache 122 needs to be updated based on the information received over communication link 126 such that it is identical to compressor byte cache 110 in order to minimize the data loss. Long range decompressor 120 copies the matched byte segments from decompressor byte cache 122 based on the information provided by signal 142. It places the decompressed blocks in the appropriate locations along with the literal segments to complete the construction of a decompressed block identical to the input block.

As discussed above with reference to FIG. 1, aspects of the present invention provide a data compression technique consisting of a long range compression front end and a short range compression back end. Details of different elements of FIG. 1 are discussed below with the help of FIG. 2.

Figure 2:
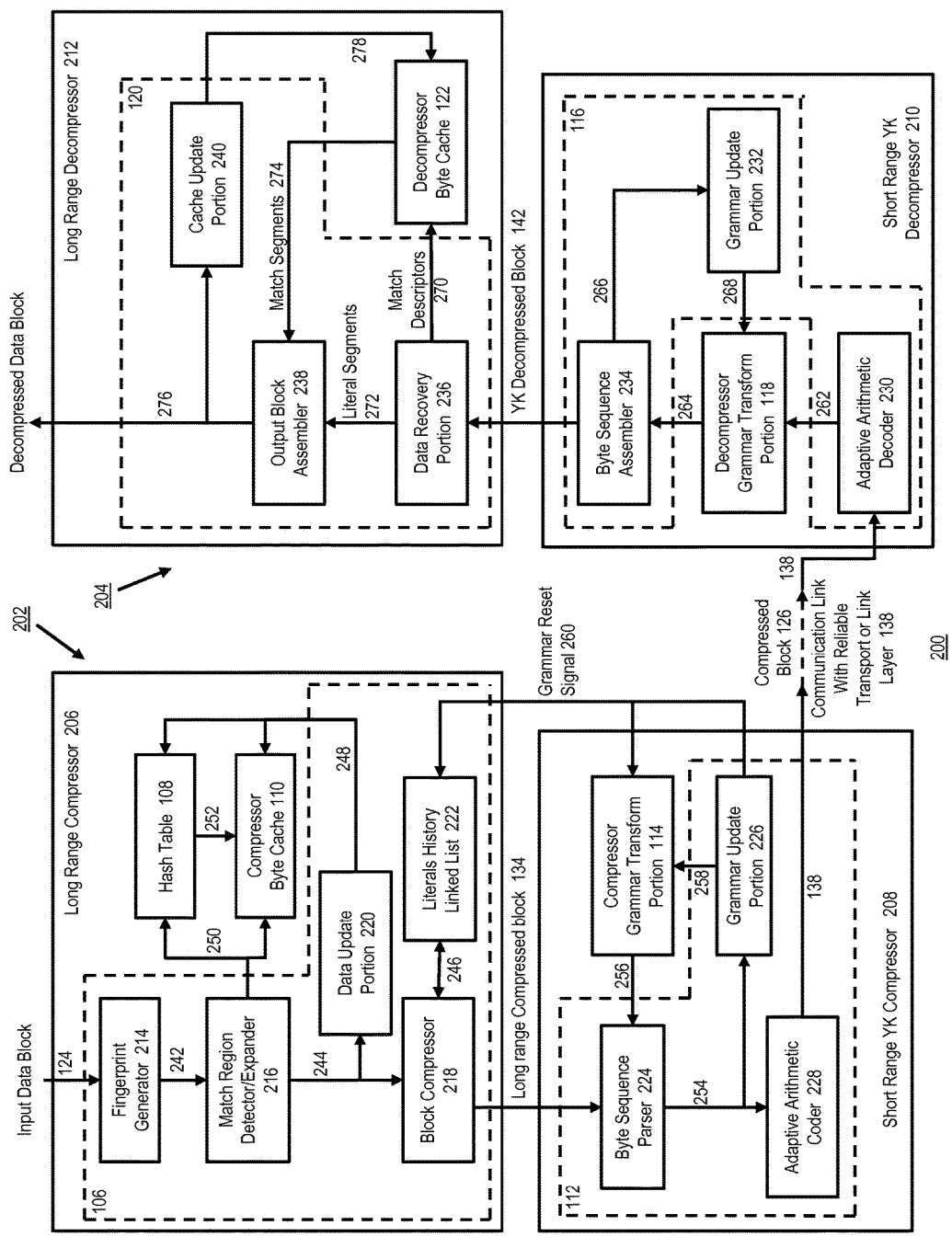
FIG. 2 illustrates an example embodiment of a communication system in accordance with an aspect of the present invention.

FIG. 2 illustrates an example embodiment of a communication system 200 in accordance with an aspect of the present invention.

As illustrated in FIG. 2, communication system 200 includes a compression side 202 and a decompression side 204. Compression side 202 includes a long range compression portion 206 and a short range compression portion 208.

Long range compression portion 206 includes long range compressor 106 (shown by a dotted region), hash table 108, and compressor byte cache 110 similar to FIG. 1, however the communication between different elements of long range compression portion 206 and its operation is explained in detail with reference to FIG. 2. Short range compression portion 208 further includes short range compressor 112, and compressor grammar transform portion 114 similar to FIG. 1, however the communication between different elements of short range compression portion 208 and its operation is explained in detail with reference to FIG. 2.

In this example embodiment, long range compressor 106 includes a fingerprint generator 214, a match region detector and expander 216, a block compressor 218, a data update portion 220 and a literals history linked list 222. In this illustration, each of fingerprint generator 214, match region detector and expander 216, block compressor 218, data update portion 220, literals history linked list 222, hash table 108 and compressor byte cache 110 are illustrated as distinct devices. However, at least two of fingerprint generator 214, match region detector and expander 216, block compressor 218, data update portion 220, literals history linked list 222, hash table 108 and compressor byte cache 110 may be combined as a unitary device. Further, in some embodiments, at least one of fingerprint generator 214, match region detector and expander 216, block compressor 218, data update portion 220, literals history linked list 222, hash table 108 and compressor byte cache 110 may be contained as a utility, program, or subprogram, in any desired tangible computer readable storage medium. In addition, the operations may be embodied by computer programs, which can exist in a variety of forms both active and inactive.

In this example embodiment, short range compressor 112 further includes a byte sequence parser 224, a grammar update portion 226 and an adaptive arithmetic coder 228. In this illustration, each of byte sequence parser 224, grammar update portion 226, adaptive arithmetic coder 228 and compressor grammar transform portion 114 are illustrated as distinct devices. However, at least one of byte sequence parser 224, grammar update portion 226, adaptive arithmetic coder 228 and compressor grammar transform portion 114 may be combined as a unitary device. Further, in some embodiments, at least one of byte sequence parser 224, grammar update portion 226, adaptive arithmetic coder 228 and compressor grammar transform portion 114 may be contained as a utility, program, or subprogram, in any desired tangible computer readable storage medium. In addition, the operations may be embodied by computer programs, which can exist in a variety of forms both active and inactive.

Decompression side 204 further includes a short range decompression portion 210 and a long range decompression portion 212. Compression side 202 and decompression side 204 communicate with each other via communication link 126 having a reliable transport or link layer.

Short range decompression portion 210 includes short range compressor 116 (as shown by dotted region), and decompressor grammar transform portion 118 similar to FIG. 1, however the communication between different elements of short range decompression portion 210 and its operation is explained in detail with reference to FIG. 2. In this embodiment, a grammar-based decompressor is used, however, any short range decompressor may be used instead.

In this embodiment, short range decompressor 116 includes an adaptive arithmetic decoder 230, a grammar update portion 232 and a byte sequence assembler 234. In this illustration, each of adaptive arithmetic decoder 230, grammar update portion 232 and byte sequence assembler 234 and decompressor grammar transform portion 118 are illustrated as distinct devices. However, in other embodiments, at least two of adaptive arithmetic decoder 230, grammar update portion 232 and byte sequence assembler 234 and decompressor grammar transform portion 118 may be combined as a unitary device. Further, in some embodiments, at least one of adaptive arithmetic decoder 230, grammar update portion 232 and byte sequence assembler 234 and decompressor grammar transform portion 118 may be contained as a utility, program, or subprogram, in any desired tangible computer readable storage medium. In addition, the operations may be embodied by computer programs, which can exist in a variety of forms both active and inactive.

In this embodiment, long range decompressor 120 includes a data recovery portion 236, an output block assembler 238 and a cache update portion 240. In this illustration, each of data recovery portion 236, output block assembler 238, cache update portion 240 and decompressor byte cache 122 are illustrated as distinct devices. However, in other embodiments, at least two of data recovery portion 236, output block assembler 238, cache update portion 240, and decompressor byte cache 122 may be combined as a unitary device. Further, in some embodiments, at least one of data recovery portion 236, output block assembler 238, cache update portion 240, and decompressor byte cache 122 may be contained as a utility, program, or subprogram, in any desired tangible computer readable storage medium. In addition, the operations may be embodied by computer programs, which can exist in a variety of forms both active and inactive.

Focusing now on compression side 202, fingerprint generator 214 is arranged to receive a stream of data that includes sequence of contiguous blocks of data, which needs to be compressed, as input data block 124. In one embodiment, input data block 124 is a byte stream comprising the internet traffic. The size of the block is variable and depends on the layer at which compression is applied in the network stack. For example, at the IP layer, the blocks may be IP pockets, or at the application layer, blocks may be segments of HTTP objects.

As the data enters input data block 124, fingerprint generator 214 computes a fingerprint for each byte of data based on a fast sliding window. In one embodiment, a recursively computed Rabin fingerprint is used to minimize complexity but any known polynomial computation scheme for generating a fingerprint may be used. In one embodiment, fingerprint window is a 64 bytes window. Each fingerprint is a compact characterization of the byte sequence within its fingerprint window. If any two fingerprints match, the byte sequences within the corresponding windows will be identical with a high probability. Thus, duplicate byte sequences can be detected by comparison of their fingerprint values rather than a byte-wise comparison.

A fingerprint is computed for each byte of input data block 124. The computed fingerprint has to be saved when the input block is added to compressor byte cache 110 after the compression of the block is completed. Since cache sizes can be large, it would be impractical to store all the fingerprints computed for each byte of the whole block. As such, a hash system is used to reduce the number of fingerprints saved in accordance with some embodiments of the present invention.

Consider the example the situation where, for a $2^{28}$ bytes of cache, there may be $2^{28}$ possible fingerprints, one for each possible distinct string of bits within compressor byte cache 110. In this example, consider that in input data block 124, only 1 out of every 64 fingerprints are retained. Therefore, as opposed to providing sufficient memory to store the possible $2^{28}$ fingerprints, only enough memory is required to store $2^{22}$ fingerprints. This would reduce storage space required for storing fingerprints and fingerprint metadata by a factor of 64.

Hence a fingerprint selection process is used to discard most of the fingerprints and select only a small subset for storage. The key requirement for the selection criterion is that it should be position independent, for example, if two fingerprint windows, at two different positions in input data block 124, have identical data, the outcome of the selection criterion should be the same for both fingerprints. In order to meet such requirements, in an example embodiment, fingerprint generator 214 uses a criterion that selects only the fingerprints that have their last $\gamma$ least significant bits as zero, where $\gamma$ is an integer number. If the underlying data is random, this results in the random sampling of the computed fingerprints. The number of selected fingerprints is reduced by a factor of about $2^\gamma$ relative to the total numbers of fingerprints computed.

As discussed above, fingerprint generator 214 computes and selects fingerprints for input data block 124. Before further discussing how the selected fingerprints are stored in hash table 108, operations of hash table 108 and compressor bytes cache 110 will be now be discussed in detail.

Hash table 108 is used to efficiently store the selected fingerprints of the data in compressor byte cache 110 and also to quickly find possible matches against the fingerprints computed for input data block 124. Hash table 108 communicates with compressor byte cache 110 via a signal 252. Each register in hash table 108 contains the fingerprint value and a metadata associated with that fingerprint. The metadata of a fingerprint is basically an index into compressor byte cache 110, and serves to point to the data from which it was computed. Metadata is used to map a fingerprint back to a byte sequence within compressor byte cache 110.

Fingerprints for the data in compressor byte cache 110, computed previously by an identical procedure, are held in hash table 108 as described earlier. The selected fingerprints for input data block 124 are compared against the fingerprints for the data in compressor byte cache 110, i.e., the fingerprints corresponding to the previously received blocks within the stream of data blocks. As discussed above, if there is a match between an input fingerprint and any of the cached fingerprint, it is indicative of a possible match between input byte sequence of input data block 124 in the fingerprint window and a sequence of bytes in compressor byte cache 110. This match has to be further verified to eliminate (i) the possibility that the byte cache fingerprint is stale, i.e., its data is no longer held in compressor byte cache 110 (because it was overwritten by newer data), and, (ii) fingerprint collisions, where two differing byte sequences result in the same fingerprint value. Once these possibilities are eliminated, it indicates a valid match that can form the basis of compression of that segment of input data block 124. Hash table 108 and compressor bytes cache 110 receive a data update signal 248 from data update portion 220, which will be described later.

Match region detector and expander 216 communicates with hash table 108 and compressor bytes cache 110 via a signal 250. Match region detector and expander 216 compares the fingerprints generated by fingerprint generator 214 for input data block 124 with the previously computed fingerprints stored in hash table 108 associated with the data stored in compressor bytes cache 110. If the input fingerprint matches a fingerprint in hash table 108, a match may exist between the fingerprint window of input data block 124 and that of compressor bytes cache 110. Note that the length of the match is at a minimum the length of the fingerprint window, but can be longer. In one embodiment, the fingerprint window is 64 bytes long. Longer matches lead to higher compression gain. To detect possible longer matches, the match region is expanded as much as possible both before and after the two matching fingerprint windows. Typically the match region could be expanded to thousands of bytes for long range compression.

The metadata of the matching fingerprint indicates the location of the fingerprint window in compressor bytes cache 110. Each input byte to the left of the fingerprint window, starting with the first byte to the left of the fingerprint window, is compared against the corresponding cached byte in compressor bytes cache 110. If there is a match, the match region expands by 1 byte to the left. This process continues to expand the match region, byte-by-byte to the left of the fingerprint windows until (i) there is no match, or (ii) the beginning of input data block 124 is reached, or (iii) the beginning of compressor bytes cache 110 is reached, whichever occurs first. Similarly, the match region is also expanded to the right of the fingerprint window until (i) there is no match, or (ii) the end of input data block 124 is reached, or (iii) the end of compressor bytes cache 110 is reached, whichever occurs first. After this expansion process is complete, a match has been detected between a segment of bytes (at least as long as a fingerprint window width, but possibly much longer) of input data block 124 and a segment of bytes stored in compressor bytes cache 110.

Once match region detector and expander 216 identifies an expanded match segment in input data block 124, it provides the relevant information to block compressor 218 via a signal 244 for compression and also to data update portion 220. Data update portion 220 communicates to hash table 108 and compressor byte cache 110 via signal 248. Data update portion 220 updates compressor byte cache 110 with the contents of input data block 124 for future matches.

In a non-limiting example embodiment, compressor byte cache 110 is implemented as a contiguous circular byte buffer scheme, with wrap-around occurring only at block boundaries. When a new input data block 124 is added to compressor byte cache 110 it overwrites the oldest data in compressor byte cache 110. If an entire input data block 124 cannot fit at the end of compressor byte cache 110, wrap-around occurs and the entire input data block 124 is added at the start of compressor byte cache 110. This ensures that input data block 124 is not split during wrap-around at the end of compressor byte cache 110. This considerably simplifies cache management, expansion of match regions and verification of stale fingerprints. The simplicity provided for verification of fingerprints also means that the size of the fingerprint metadata that has to be stored is much smaller, reducing storage complexity. Contiguous storage also allows expansion of match regions across (cached) block boundaries, leading to longer matches and improved compression gain. Details of the implementation of compressor bytes cache 110 will now be described in greater detail with reference to FIG. 3.

Figure 3:
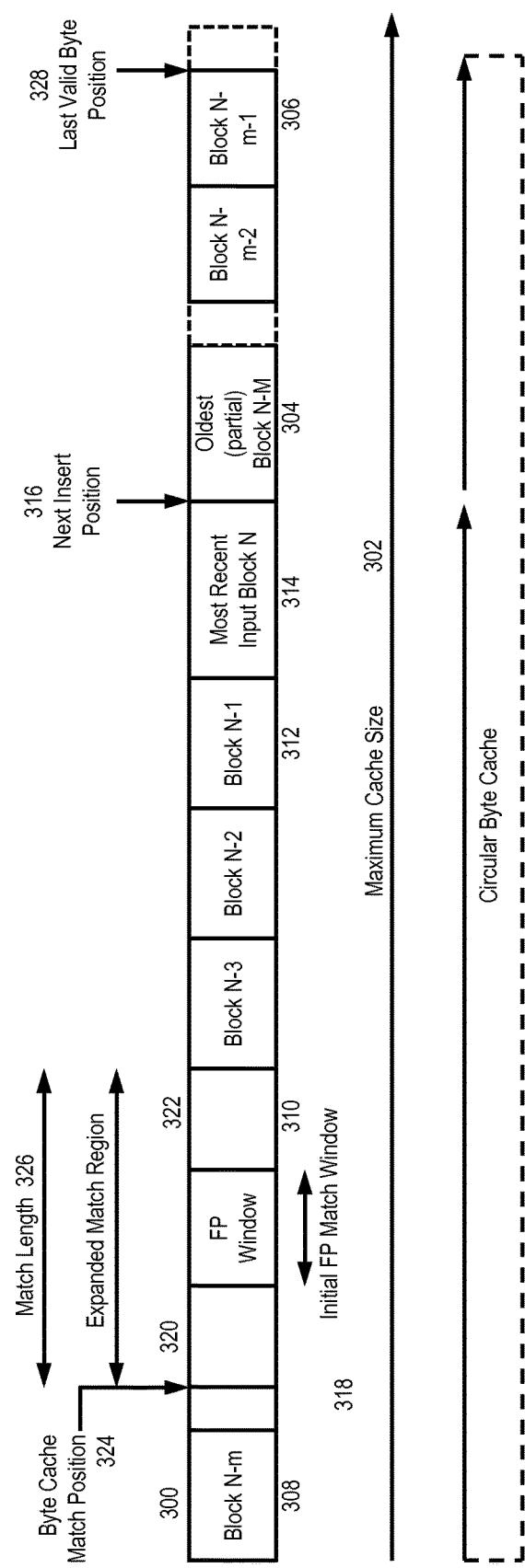
FIG. 3 illustrates an example embodiment of a circular byte cache in accordance with an aspect of the present invention.

FIG. 3 illustrates an example embodiment of a circular byte cache 300 in accordance with an aspect of the present invention.

As illustrated in the figure, circular byte cache 300, with a maximum cache size 302, includes a plurality of segments, a sampling labeled as segments 304, 306, 308, 310, 312 and 314.

Segment 304 contains the oldest block in circular byte cache 300, which is about to be overwritten by the next block, indicated by a location 316. Segment 314 is the most recent block, which has been written in circular byte cache 300. Block 310 includes a region 318, a region 320 and a region 322. Region 318 corresponds to a fingerprint window of a cached fingerprint that matches a fingerprint in the current input block and that is detected by match region detector and expander 216. Accordingly, in this example, a consecutive string of data of the most recent input block, block 314, matches the consecutive string of data within region 318. As there is a match, the region is expanded beyond the initial window to the left (more recently received data) and to the right (less recently received data). Region 320 corresponds to an expansion of by match region detector and expander 216 to the right. Region 322 corresponds to a window created by match region detector and expander 216 to the left. Once the total matching is determined, the byte cache match position within circular byte cache 300 is known. Byte cache offset 324 indicates the start of expanded match region that matches with a segment in the most recent input block, block 314, whereas the total match length is represented by double arrows 326.

Circular byte cache 300 is implemented as a contiguous circular byte buffer, with wrap around occurring only at block boundaries, instead of breaking up a block across cache boundaries. When a new input block is added to circular byte cache 300, it overwrites the oldest data in the cache. If an entire input block cannot fit at the end of circular byte cache 300, wrap-around occurs and the entire block is added at the start of circular byte cache 300.

For example, if a new block is too big to fit between next insert position 316 and last valid byte position 328 then instead of splitting up the block across cache boundaries, it is added at the start of segment 308.

Implementation of circular byte cache 300 as a contiguous circular byte buffer, considerably simplifies cache management, expansion of match regions and verification of stale fingerprints. The simplicity provided for verification of fingerprints also means that the size of the fingerprint metadata that has to be stored is much smaller, reducing storage complexity. Contiguous storage also allows expansion of match regions across (cached) block boundaries, leading to longer matches and improves compression gain.

Compressor byte cache 110 and decompressor byte cache 122 are example embodiments of circular byte cache 300, in accordance with aspects of the invention. Implementation of circular byte cache 300 as a contiguous circular byte buffer, with wrap-around only at block boundaries, has a number of advantages over block based or generic circular buffer based schemes. The contiguous storage of bytes translates to less wasted storage space when compared to block based storage. Contiguous storage also allows expansion of match regions across (cached) block boundaries, which is not possible when caching is done in terms of blocks. Block based caching typically requires the use of an absolute linear block index in order to detect stale fingerprints. This type of indexing has two problems: (i) the index, which is several bytes long, needs to be stored as part of the fingerprint metadata, increasing storage complexity, and (ii) when the linear index ultimately wraps around, this event has to be detected and appropriate measures taken, which introduces complexity. In contrast, the contiguous circular byte buffer proposed here overcomes these problems, uses less storage space, is simpler to implement and also improves compression gain.

Along with updating compressor bytes cache 110, data update portion 220 also updates hash table 108 with the selected fingerprints for input data block 124 along with the metadata. Note that the metadata corresponds to input data block 124 that was just inserted into compressor bytes cache 110. Given a fingerprint value to be stored in hash table 108, a hash function is used to compute an index to a slot of hash table 108. An attempt is made to insert the fingerprint into the hash slot. Any matched fingerprint, regardless of whether its matching fingerprint was valid, stale or had a fingerprint collision, simply overwrites the existing metadata in the slot. This ensures that the hash table metadata entry for a fingerprint always points to the newest occurrence of a byte segment in compressor byte cache 110. An unmatched fingerprint is inserted successfully only if the slot is unoccupied or contains a stale fingerprint. Even if a large number of fingerprints fail to be inserted, it is not detrimental to performance as explained below.

As new data is inserted into compressor byte cache 110, it overwrites older data. However, hash table 108 may continue to hold the fingerprints that correspond to the overwritten data. Such stale fingerprints are only deleted on an as-needed basis; i.e., if a new fingerprint needs to be inserted into a slot occupied by a stale fingerprint. A stale fingerprint is detected by recomputing the fingerprint value using the data pointed to by the metadata. If the recomputed fingerprint does not match the stored fingerprint, it indicates that the fingerprint has become stale. i.e., the data from which it was computed has since been overwritten by newer input data. Such a stale fingerprint can be overwritten by the fingerprint going to be inserted. This approach of detection of stale fingerprint considerably reduces the amount of storage needed to hold the metadata and also simplifies the implementation of compressor bytes cache 110 by avoiding the need for absolute indexing.

The degree to which hash insertion failures occur depends upon the loading factor of hash table 108 (i.e., the number of hash table slots divided by the number of byte cache fingerprints that have to be inserted into hash table 108) as well as the hash function used. It is desirable to keep the loading factor low to minimize the storage complexity of hash table 108. On the other hand, if this loading factor is too small, hash collisions occur, i.e., cases where a fingerprint cannot be inserted because its slot is occupied by a different fingerprint. If a fingerprint is not inserted, a potential duplication of the data within the fingerprint window cannot be detected, resulting in loss of compression gain.

Therefore, design of hash table 108 is a tradeoff between storage complexity and performance. It is possible to alleviate this by using multiple hash functions. However, it was found that for the purposes of long range compression, it is possible to tolerate relatively high rates of hash collision and measures such as bucketed hashing and multiple hash functions were not critical. This occurs since the typical match region is much longer than a fingerprint window. Consequently a match region contributes a number of selected fingerprints. Even if some of the selected fingerprints fail to be inserted, as long as the other (even a single) fingerprint is successfully inserted, the entire match region will be detected. The key contributor is the expansion of match regions once a fingerprint match is found.

Returning to FIG. 2, block compressor 218 receives input data block 124 along with the information for the matched segment from match region detector and expander 216. Block compressor 218 is operable to perform long range compression of the matched segment and also to determine which bytes need to be passed along as literal segments to short range compression portion 208. However, under certain conditions, encoding the expanded matched segment of input data block 124 in to a match descriptor may not be the most efficient strategy. It may be more efficient to do short range compression instead of long range compression for certain segments of data blocks. This is explained further with reference to literals history linked list 222.

If short range compressor 112 was used to compress a pervious occurrence of an identical byte segment (or a byte segment containing the current byte segment), short range compressor 112 is more likely to be more efficient than long range compressor 106 for such a segment. This determination also has to take into account the length of such a segment, as longer segments are an exception to this rule. To make this determination, long range compressor 106 maintains a list of descriptors of the literal segment in literals history linked list 222 that were passed on to short range compressor 112. When an expanded match segment is identified in input data block 124, with its length exceeding a minimum length threshold, literals history linked list 222 is checked to see if it is contained in the list. If the segment is in literals history linked list 222, then such a segment is not compressed into a match descriptor; instead it is directly passed in literal form to short range compressor 112 for compression. If the segment is not in literals history linked list 222, then such a segment is compressed by block compressor 218. Block compressor 218 communicates with literals history linked list 222 via a signal 246. Updating of literals history linked list 222 with reference to grammar update is explained further in context of short range compressor 112.

Block compressor 218 is operable to compress the expanded matched segment of input data block 124 by replacing it entirely by a "match descriptor" containing (i) the position of the starting byte of the match in compressor bytes cache 110, (ii) the position of the starting byte of the match in input data block 124, and (iii) the length of the match. Since the match descriptor can be only a few bytes long, whereas the match segments can be several tens, hundreds or even larger number of bytes, significant compression gains can be achieved. The match descriptor is all the information needed by long range decompressor 120 to extract the byte segment from decompressor byte cache 122, so that input data block 124 can be exactly reconstructed.

In certain cases, input data block 124 may contain zeros or more such match regions, interspersed with "literal" regions, for which no match was available in compressor bytes cache 110. Each match region is replaced by a match descriptor and the literal bytes are preserved exactly and passed on to short range compressor 112 for second stage of compression.

Block compressor 218 provides a long range compressed block for each input data block 124 processed to short range compressor 112 via a signal 134. Long range compressed block includes information about block length, match count, match descriptors and literal byte segments. The format of long range compressed block will be discussed in detail with the help of FIG. 4.

Figure 4:
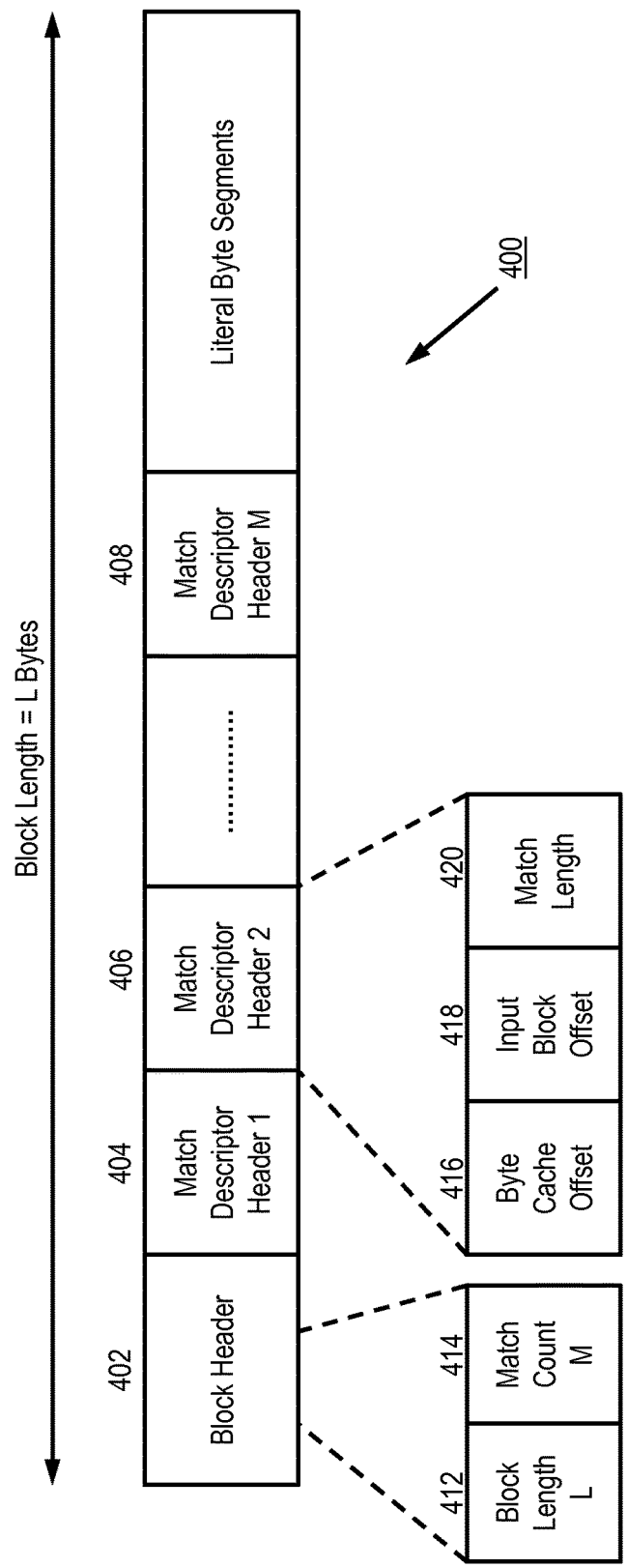
FIG. 4 illustrates an example embodiment of a long range compressed block in accordance with an aspect of the present invention.

FIG. 4 illustrates an example embodiment of a long range compressed block 400 in accordance with an aspect of the present invention.

As illustrated in the figure, long range compressed block 400 includes a block header field 402, a plurality of match descriptor header fields (examples shown as a match descriptor header field 404, a match descriptor header field 406, a match descriptor header field 408) and a literal byte segments field 410.

Block header field 402 further includes a block length field 412 and a match count field 414. Block length field 412 indicates total number of bytes in long range compressed block 400. Match count field 414 indicates total number of match segments that were found in input data block 124.

Each match descriptor header field includes a byte cache offset field, an input block offset field and a match length field. For example, match descriptor header field 406 further includes a byte cache offset field 416, an input block offset field 418 and a match length field 420. Note that all match descriptor header fields 1, 2, . . . M have the same format as match descriptor header field 406, even though only match descriptor header field 406 is shown here in expanded form.

Byte cache offset field 416 corresponds to byte cache offset 324 of circular byte cache 300 of FIG. 3. In particular, byte cache offset field 416 indicates the offset location with respect to the beginning of compressor byte cache 110, where the match was found. Input block offset field 418 indicates the offset byte with respect to the beginning of input data block 124, where the match was found. Match length field 420 indicates the length of the matched segment in bytes.

Match count field 414 and match descriptor fields 416, 418 and 420 may be compressed using a variable length code. Each of these entities may be encoded using the 7 least significant bits of one or more bytes, with the most significant bits serving as "continuation bits." If the entity is small enough to be encoded using the 7 least significant bits of all the bytes so far used, the most significant bit is set to zero. Having the most significant bit set as a zero indicates that the byte is the last byte used in encoding the entity. Having the most significant bit set as a 1 means that the next byte was also used in encoding the entity and decoding should continue until a byte with 0 in its most significant is found. Match count, offsets and match lengths tend to be small values most of the time, but can occasionally take on large values. The variable length scheme provides significant savings in representing these values.

Figure 5:
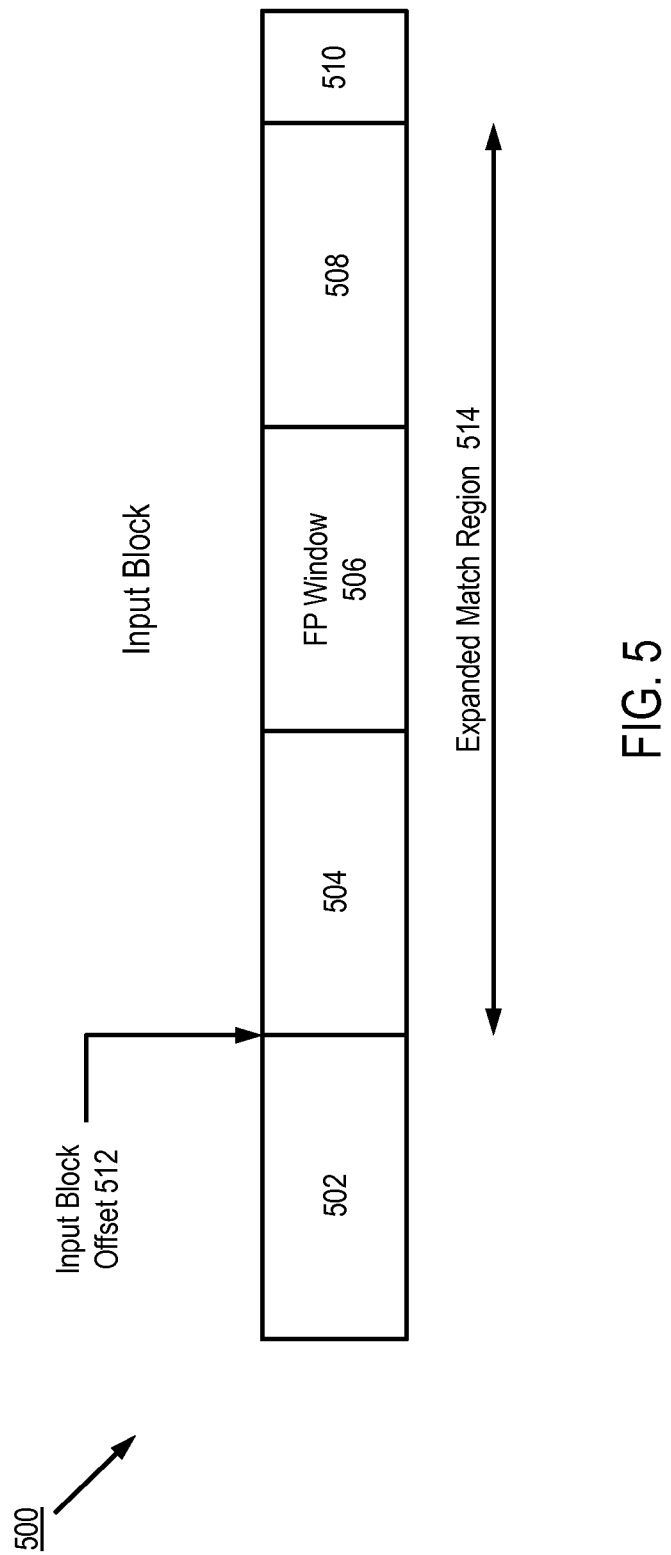
FIG. 5 illustrates an example embodiment of an input block in accordance with an aspect of the present invention.

FIG. 5 illustrates an example embodiment of an input block 500 in accordance with an aspect of the present invention. Input block 500 corresponds to a block of data input into block compressor 218 from match region detector and expander 216.

As illustrated in the figure, input block 500 includes a segment 502, a segment 504, a segment 506, a segment 508 and a segment 510. In one embodiment, an input block offset 512 indicates the start of segment 504, segment 506 indicates a fingerprint window and segments 504, 506 and 508 together mark the expanded match region equivalent to match length 420. Input block offset 512 corresponds to input block offset field 418 of long range compressed block 400 of FIG. 4. Segment 506 corresponds to the window created by fingerprint generator portion 214 and additionally corresponds with region 318 of circular byte cache 300 of FIG. 3. Segment 506 was compared with a similar sized window from previous bytes and found to match. The match region, segment 506, was then extended in the left direction until there was no longer matching consecutive bits. This extended match region, segment 504, corresponds to region 320 of circular byte cache 300 of FIG. 3. The match region, segment 506, was additionally extended in the right direction until there was no longer matching consecutive bits. This extended match region, segment 508, corresponds to region 322 of circular byte cache 300 of FIG. 3.

In other words, there is a match in input block 500 starting at byte location 512 with a segment in a byte cache, where the match length corresponds to an expanded match region indicated by the double arrows 514.

Block compressor 218 creates a match descriptor header for each matched segment found in input data block 124. If no matched segment were found then there are no match descriptor headers and the match count field 414 is zero.

Literal byte segments field 410 contains the unmatched bytes in input data block 124, in exactly the same order of occurrence in input data block 124. If all the bytes in the input data block 124 was matched to one or more segments in compressor byte cache 110, literal byte segments field 410 is empty, i.e., has zero bytes.

Returning to FIG. 2, output of block compressor 218 is received by short range compression portion 208. Byte sequence parser 224 is operable to receive signal 134 from block compressor 218 and a signal 256 from compressor grammar transform portion 114. Short range compressor 112 uses byte sequence parser 224 to find out the longest prefix of new data it has received that is already representable by an existing grammar symbol. Byte sequence parser 224 parses the incoming byte sequence on signal 134 based on the existing grammar symbols in compressor grammar transform portion 114. Once byte sequence parser 224 is done parsing for each grammar symbol, it communicates to grammar update portion 226 via a signal 254 to update the grammar by possibly adding a new symbol, or modifying a existing symbol.

In accordance with another aspect of the present invention, short range compressor 112 may provide a feedback signal to long range compressor 106 to affect operation of long range compressor 106. An example embodiment of this aspect will now be described in greater detail.

Grammar update portion 226 also keeps track of when the grammar in compressor grammar transform portion 114 needs to be reset. It provides a signal 260 to compressor grammar transform portion 114 to initialize the grammar. In this embodiment of short range compressor 112, signal 260 is also fed to reset literals history linked list 222. Therefore, literals history linked list 222 is reinitialized whenever the grammar is initialized, and hence contains only the literals since the most recent grammar initialization. This means that the grammar for short range compressor 112 has variables that can compactly represent future occurrences of such literal segments.

When an expanded match segment is identified in input data block 124, with its length not exceeding a maximum length threshold, the literals list is checked to see if it is contained in the list. If this is true, then such a segment is not compressed into a match descriptor; instead it is directly passed in literal form to short range compressor 112 for compression. If this is not true, such a match segment is compressed by long range compressor 106 as described earlier. Note that the selective compression strategy does not require that any indication of this choice be passed to the decompression portion 204.

Adaptive arithmetic coder 228 maps the sequence of symbols received from byte sequence parser 224 into bits. It is based on the presumption that certain grammar symbols occur more often than others. Adaptation allows updating of tables keeping track of frequency of occurrence for incoming symbols while processing the data, which improves the compression ratio of the coders. Adaptive arithmetic coder 228 follows the entropy encoding technique, which suggests that the symbols that are likely to occur more often can be represented using fewer bits. When a sequence is processed by arithmetic encoding, frequently used symbols are represented with fewer bits and not-so-frequently used symbols are represented with more bits, resulting in overall reduction in number of bits used. Adaptive arithmetic coder 228 provides efficiently compressed and encoded output 138 ready for transmission.

Output of short range compressor 112 is transmitted over communication link 126. It is essential that communication link 126 provides a reliable transport or link layer to ensure that compressed blocks 138 are delivered to decompression portion 204 in the order of transmission and without errors or lost blocks. Short range decompression portion 210 performs the inverse operation of short range compression portion 208, in order to reproduce blocks consisting of match descriptors and literal segments from compressed blocks 138.

Adaptive arithmetic decoder 230 receives compressed block 138 from communication link 126, which were encoded by adaptive arithmetic coder 228. In order to decode the bits back to symbols such that the decoded symbols exactly match with the encoded symbols on compression side 202, frequency tables in adaptive arithmetic decoder 230 should be updated in the same way and in the same step as in adaptive arithmetic coder 228. Adaptive arithmetic decoder 230 provides decoded symbols 262 to decompressor grammar transform portion 118.

Decompressor grammar transform portion 118 works with grammar update portion 232 to provide decompressed grammar transform of the symbols in to bytes to byte sequence assembler 234. Note that short range decompressor 116 needs to be aware of the grammar transforms and updates on short range compressor 112 side such that the grammars on both compressor and decompressor sides are identical, in order to recover original input data block 124.

Byte sequence assembler 234 receives a signal 264 from decompressor grammar transform portion 118 and is operable to assemble the bytes in to proper format of decompressed block 142, which includes match descriptors and literal segments. The format of decompressed block 142, which is identical to compressed block 134, will be explained further on with the help of FIG. 4. Byte sequence assembler 234 updates grammar update portion 232 by adding any new symbols via a signal 266.

Short range decompression portion 210 provides decompressed block 142, which includes match descriptors and literal segments, to long range decompression portion 212. Long range decompression portion 212 performs the inverse operation of long range compressed portion 206, in order to reconstruct input data block 124 based on the decompressed match descriptors and literal segments.

Long range decompression portion 212 includes long range decompressor 120 (as shown by dotted line), and decompressor byte cache 122 similar to FIG. 1, however the communication between different elements of long range decompression portion 212 and its operation is explained in detail with reference to FIG. 2.

Data recovery portion 236 is operable to receive decompressed match descriptors and literal segments from decompressed block 142. Based on the format of decompressed block 142, as discussed in FIG. 4, it separates out the match descriptors and literal segments. Data recovery portion 236 provides match descriptors 270 to decompressor byte cache 122, which indicates the number of bytes that need to be fetched and the starting address of the byte segment in decompressor byte cache 122. Data recovery portion 236 provides literal segments 272 to output block assembler 238.

Decompressor byte cache 122 fetches matched segments based on the starting address and match length provided in match descriptor and provides matched segments 274 to output block assembler 238. Note that long range decompression portion 212 needs to be aware of the updates in compressor byte cache 110 such that the cache contents on both compressor and decompressor sides are identical, in order to recover original input data block 124. Decompressor byte cache 122 also receives a signal 278 from cache update portion 240 in order to add the byte segments which have been decompressed.

Output block assembler 238 reconstructs input data block 124 based on literal segments 272 received from data recovery portion 236 and matched segments 274 received from decompressor byte cache 122. A block header, illustrated in FIG. 4 later on, indicates the number of match descriptors contained in compressed block 138 received from compressor portion 202. Each match descriptor specifies where the matched bytes are in decompressor byte cache 122, the length of the match and the location of the match segment in decompressed block 142. Output block assembler 238 simply has to construct the matched part of the block by simply copying the matched byte segments 274 from decompressor byte cache 122 and placing them in the correct locations of decompressed block. This can possibly leave unfilled gaps in the decompressed block, corresponding to the literal segments. Each unfilled gap can then be filled using the literal segment 272, since these bytes occur in exactly the same order as they appeared in input data block 124. This completes the construction of a decompressed block 276 identical to input data block 124.

Similar to data update portion 220 in long range compression portion 206, cache update portion 240 in long range decompression portion 212 adds decompressed block 276 to decompressor byte cache 122 in order to overwrite the oldest bytes. This is performed to make sure that the updated decompressor byte cache 122 is identical to compressor byte cache 110 so that future input data block 124 is decompressed correctly.

The selective compression of input data block 124, depending on the input characteristics, compressor byte cache 110 contents and the state of the grammar, results in improved compression gain over schemes that process each input segment by the same processing steps of long and/or short range compression.

The joint optimization of the long range and short range compression is an advantage over techniques that apply only long term compression or only short term compression or apply the two independently such that they are unaware of each other. There is a significant degree of interdependence between the performances of the two stages of compression. Consequently, it is important to optimize the design parameters of the long range compressor 106 taking into consideration the behavior of the short range compressor 112.

Extensive parametric studies were conducted to determine the optimal parameters such as minimum match length, fingerprint window length, fingerprint selection rate, size of the byte cache and the size of the grammar. The compression gain of only long term compression portion 206 increases as the minimum match segment size is reduced, because smaller matches can be detected and compressed. However, this reduces the performance of short range compressor 112 to the degree that the overall compression gain deteriorates with reducing minimum match length. The reason for this behavior is that the smaller matches disrupt the continuity of the byte sequence at the input of short range compressor 112 (i.e., many smaller literal segments). This makes it more difficult for compressor grammar transform portion 114 to find the underlying structure. Therefore, it is preferable to use a larger value for the minimum match length, such that the overall compression gain is maximized.

Formats of a long range compressed data block, an input data block and a circular byte cache will be discussed next in accordance with aspects of the invention.

A summary of test results that demonstrate the advantages of the compression scheme, in accordance with aspects of the invention, is presented next. Table 1 displays results for two types of data showing performance gains of joint long and short range compression.

TABLE 1

A summary of performance gains of joint long and short range compression

| Data Type | Compression Gain with only V.44 (Lempel-Ziv Based Short Range compression) | Compression Gain with only Grammar Based Short Range compression | Compression Gain with Long range compression and Short Range grammar-based compression |
|---|---|---|---|
| Compressible HTTP Response Entity data | 3.67 | 9.99 | 19.11 |
| HTTP Response data containing already compressed entities | 1.05 (estimated) | 1.1 (estimated) | 1.37 |

Compressible HTTP response entity data represents data that is a subset of the traffic, which is known not to contain entities that are not already compressed at the source. Such traffic is uncompressed and hence can be compressed with high compression gains. This is evident from the results presented in the first row of Table 1. Results are presented for v.44, which is a Lempel-Ziv type of compressor with 65 KB of history buffer, a grammar-based compressor with 5 MB space for grammar and a joint long range compressor (100 MB byte cache) and grammar (5 MB grammar). Compression gain for v.44, Lempel-Ziv type of compressor is 3.67. Compression gain for grammar-based only short range compressor is 9.99. Compression gain for joint long range compressor and a short range grammar-based compressor, in accordance with aspects of the invention, is 19.11. Hence, it can be seen that while a grammar-based compressor provides an improvement over v.44, integration of a long range compressor front end almost doubles the compression gain for this type of data.

The second row of Table 1 shows the results for HTTP response entity data that can contain entities that are already compressed at the source. Typically these are embedded images (JPEG, GIF, PNG) or compressed file archives. As expected, the compression possible in this case is smaller. This is evident from the results presented in the second row. Compression gain for v.44, Lempel-Ziv type of compressor is 1.05 (estimated). Compression gain for grammar-based only short range compressor is 1.1 (estimated). Compression gain for joint long range compressor and a short range grammar-based compressor, in accordance with aspects of the invention, is 1.37. However, even in this case, the addition of a long range compressor front end has a significant impact, providing about a 35% improvement over using only short range compression. These results are clearly indicative of the advantages that are obtained by the techniques presented in accordance with aspects of the invention.

As discussed above with the help of FIGS. 1-5, aspects of the present invention provide lossless data compression techniques, which provide improvement over currently deployed techniques for efficient transmission of internet traffic over communication links such as satellite or terrestrial links. The lossless data compression technique, in accordance with an aspect of the invention, consists of two stages of compression.

A long range compressor front end, based on a cache containing previously transmitted bytes, captures macro redundancies in the byte stream. The main role of this stage is to provide the compressor access to a large history of past transmitted data (i.e., a large memory buffer of several tens or hundreds of megabytes), while keeping as low as possible the processing complexity needed to exploit the large amount of stored data to achieve compression. The advantage of this stage is that macro redundancies as seen within a long history of the byte stream can be captured with very modest processing resources.

Long range compressor is designed to have a very low computational complexity, and hence can use a large history buffer (cache) that is tens or hundreds of megabytes. As a result it can exploit the long range redundancies in the internet web traffic. Also, even if the transmitted byte stream contains objects that were compressed at the source, if such objects are duplicated in the transmitted byte stream within the history buffer of the long range compressor, they are very efficiently compressed. The limitation on the complexity of the long range compressor means that it cannot completely eliminate certain types of redundancies. Such redundancies are eliminated by a more powerful second stage that combines a grammar transform and arithmetic coding, for example, a grammar-based compressor, in one embodiment of the present invention.

Second stage is based on a grammar-based compressor, which uses sophisticated grammar transform and adaptive arithmetic coding. However, any type of short range compressor may be used. The main role of the second stage is to exploit any residual or micro redundancies in the output of the first stage by applying much more powerful compression techniques as compared to the first stage. Since the first stage has already eliminated long range redundancies, the second stage can operate with a smaller history (i.e., less data to be processed), with no loss in performance. This permits the use of far more powerful techniques than the first stage, and delivers near optimal compression gain. The grammar transform and adaptive arithmetic coder used by the second stage are keys to its performance. The strategy of capturing the long range macro redundancies by a simpler computation efficient first stage, allows a more sophisticated second stage in order to capture the more complex structural micro redundancies. This keeps the complexity of the overall scheme at a reasonable level, while achieving near optimal compression gains.

The data compression technique, in accordance with aspects of the invention, exploits redundancy in input data stream at the lowest byte stream level to achieve data compression. Operating at the byte level has the advantage that this technique has a much wider applicability, since it is unaware of higher layer protocols, applications or the type of data represented by the byte stream. This permits it to be applied at any layer in the network protocol stack: For example, it can be applied at the application layer (on byte streams comprising HTTP objects) or at the network layer on IP packets.

The data compression technique, in accordance with aspects of the invention, will result in significant reductions in the channel bandwidth and/or transmission power requirements for carrying web traffic between internet end points. This basic capability can be exploited in different ways. For example, a higher number of users can be supported on a given satellite transponder bandwidth or a given terrestrial backhaul link capacity. Alternately, the same number of users can be served with a higher bandwidth, which reduces the perceived latency in the case of interactive applications or increases the response time in the case of web surfing. While the exact degree of improvement depends on the nature of the traffic and implementation, the reduction in out-route bandwidth can be as high as 25% over currently deployed techniques.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method, performed by a data compression device, for compression of a communications data stream, wherein the communications data stream comprises a streaming sequence of data blocks and each data block comprises a sequence of data bytes, the method comprising:

receiving a one data block of the streaming sequence of data blocks to be compressed;

generating a fingerprint for each data byte of the one data block based on a sliding fingerprint window, wherein the sliding fingerprint window is of a length of a number of data bytes that is less than a length of the one data block;

selecting a fingerprint subset comprising a subset of the generated fingerprints;

comparing each fingerprint of the fingerprint subset to prior fingerprints stored in a fingerprint cache, wherein each of the prior fingerprints was generated from a respective sequence of data bytes of one or more previously received data blocks of the streaming sequence of data blocks stored in a byte cache, wherein the respective sequence of data bytes is of a length that matches the length of the sliding fingerprint window;

determining that a one fingerprint of the fingerprint subset matches a one of the prior fingerprints;

comparing the data bytes from which the one fingerprint was generated to the data bytes of the one or more previously received data blocks from which the matching one of the prior fingerprints was generated;

determining that the data bytes from which the one fingerprint was generated matches the data bytes from which the matching one of the prior fingerprints was generated; and within the one data block, replacing the data bytes from which the one fingerprint was generated with a match descriptor, wherein the match descriptor indicates a location within the byte cache that stores the matching data bytes from which the matching one of the prior fingerprints was generated.

2. The method according to claim 1, further comprising:

performing a left expansion by (i) comparing a next subsequent data byte, within the one data block, to the left of the data bytes from which the one fingerprint was generated to a next subsequent data byte, within the one or more previously received data blocks stored in the byte cache, to the left of the data bytes from which the matching one of the prior fingerprints was generated, and (ii) determining whether the next subsequent data byte to the left of the data bytes from which the one fingerprint was generated matches the next subsequent data byte to the left of the data bytes from which the matching one of the prior fingerprints was generated;

repeating the left expansion for a further subsequent data byte within the one data block and within the one or more previously received data blocks stored in the byte cache until a match is not determined, an end of the one data block is reached, or an end of the one or more previously received data blocks stored in the byte cache is reached;

performing a right expansion by (i) comparing a next subsequent data byte, within the one data block, to the right of the data bytes from which the one fingerprint was generated to a next subsequent data byte, within the one or more previously received data blocks stored in the byte cache, to the right of the data bytes from which the matching one of the prior fingerprints was generated, and (ii) determining whether the next subsequent data byte to the right of the data bytes from which the one fingerprint was generated matches the next subsequent data byte to the right of the data bytes from which the matching one of the prior fingerprints was generated;

repeating the right expansion for a further subsequent data byte within the one data block and within the one or more previously received data blocks stored in the byte cache until a match is not determined, an end of the one data block is reached, or an end of the one or more previously received data blocks stored in the byte cache is reached; and within the one data block, replacing the data bytes from which the one fingerprint was generated and each of the data bytes that resulted in a match from the left and right expansions with a match descriptor, wherein the match descriptor indicates a location within the byte cache that stores the matching data bytes from which the matching one of the prior fingerprints was generated and each of the data bytes within the one or more previously received data blocks stored in the byte cache that resulted in a match from the left and right expansions.

3. The method according to claim 1, wherein each of the prior fingerprints stored in the fingerprint cache includes an index into the byte cache that points to a location that stores the respective sequence of data bytes of the one or more previously received data blocks of the streaming sequence of data blocks.

4. The method according to claim 1, further comprising:

applying a hash function to each fingerprint of the fingerprint subset, wherein a result of the application of the hash function to each fingerprint of the fingerprint subset provides an index into the fingerprint cache; and wherein the step of comparing each fingerprint of the fingerprint subset to prior fingerprints stored in a fingerprint cache consists of comparing each fingerprint of the fingerprint subset to a prior fingerprint stored in the fingerprint cache at a location indexed by the hash result corresponding to the respective fingerprint of the fingerprint subset, and wherein the step of determining that a one fingerprint of the fingerprint subset matches a one of the prior fingerprints consists of determining that a one fingerprint of the fingerprint subset matches the prior fingerprint stored in the fingerprint cache at the location indexed by the hash result corresponding to the one fingerprint of the fingerprint subset.

5. The method according to claim 4, wherein each of the prior fingerprints stored in the fingerprint cache includes an index into the byte cache that points to a location that stores the respective sequence of data bytes of the one or more previously received data blocks of the streaming sequence of data blocks.

6. The method according to claim 1, wherein the selection of the fingerprint subset is independent of a position within the one data block of the sliding fingerprint window.

7. The method according to claim 1, further comprising:

leaving, as literal segments, additional data bytes of the one data block.

8. The method according to claim 7, further comprising:

performing a short-range compression of the literal segments based on a short-range of the one or more previously received data blocks.

9. The method according to claim 8, wherein the short-range compression comprises a compact and structured form of dictionary based compression, where the process looks for patterns in the literal segments based on assumptions that certain phrases occur more often than others.

10. The method according to claim 9, wherein the short-range compression comprises a grammar-based compression process.

11. An apparatus for compression of a communications data stream, wherein the communications data stream comprises a streaming sequence of data blocks and each data block comprises a sequence of data bytes, the apparatus comprising:

an input interface configured to receive a one data block of the streaming sequence of data blocks to be compressed;

a byte cache memory configured to store one or more previously received data blocks of the streaming sequence of data blocks;

a fingerprint cache memory configured to store prior fingerprints, wherein each such prior fingerprint was generated from a respective sequence of data bytes of the one or more previously received data blocks of the streaming sequence of data blocks stored in the byte cache, and wherein the respective sequence of data bytes is of a length that matches a length of a sliding fingerprint window; and a long-range compression processor configured to (i) generate a fingerprint for each data byte of the one data block based on the sliding fingerprint window, wherein the sliding fingerprint window is of a length of a number of data bytes that is less than a length of the one data block, (ii) select a fingerprint subset comprising a subset of the generated fingerprints, (iii) compare each fingerprint of the fingerprint subset to the prior fingerprints stored in the fingerprint cache (iv) determine that a one fingerprint of the fingerprint subset matches a one of the prior fingerprints, (v) compare the data bytes from which the one fingerprint was generated to the data bytes of the one or more previously received data blocks from which the matching one of the prior fingerprints was generated, (vi) determine that the data bytes from which the one fingerprint was generated matches the data bytes from which the matching one of the prior fingerprints was generated, and (vii) within the one data block, replace the data bytes from which the one fingerprint was generated with a match descriptor, wherein the match descriptor indicates a location within the byte cache that stores the matching data bytes from which the matching one of the prior fingerprints was generated.

12. The apparatus according to claim 11, wherein the long-range compression processor is further configured to:
perform a left expansion by (i) comparing a next subsequent data byte, within the one data block, to the left of the data bytes from which the one fingerprint was generated to a next subsequent data byte, within the one or more previously received data blocks stored in the byte cache, to the left of the data bytes from which the matching one of the prior fingerprints was generated, and (ii) determining whether the next subsequent data byte to the left of the data bytes from which the one fingerprint was generated matches the next subsequent data byte to the left of the data bytes from which the matching one of the prior fingerprints was generated;
repeat the left expansion for a further subsequent data byte within the one data block and within the one or more previously received data blocks stored in the byte cache until a match is not determined, an end of the one data block is reached, or an end of the one or more previously received data blocks stored in the byte cache is reached;
perform a right expansion by (i) comparing a next subsequent data byte, within the one data block, to the right of the data bytes from which the one fingerprint was generated to a next subsequent data byte, within the one or more previously received data blocks stored in the byte cache, to the right of the data bytes from which the matching one of the prior fingerprints was generated, and (ii) determining whether the next subsequent data byte to the right of the data bytes from which the one fingerprint was generated matches the next subsequent data byte to the right of the data bytes from which the matching one of the prior fingerprints was generated;
repeat the right expansion for a further subsequent data byte within the one data block and within the one or more previously received data blocks stored in the byte cache until a match is not determined, an end of the one data block is reached, or an end of the one or more previously received data blocks stored in the byte cache is reached; and within the one data block, replace the data bytes from which the one fingerprint was generated and each of the data bytes that resulted in a match from the left and right expansions with a match descriptor, wherein the match descriptor indicates a location within the byte cache that stores the matching data bytes from which the matching one of the prior fingerprints was generated and each of the data bytes within the one or more previously received data blocks stored in the byte cache that resulted in a match from the left and right expansions.

13. The apparatus according to claim 11, wherein each of the prior fingerprints stored in the fingerprint cache includes an index into the byte cache that points to a location that stores the respective sequence of data bytes of the one or more previously received data blocks of the streaming sequence of data blocks.

14. The apparatus according to claim 11, wherein the long-range compression processor is further configured to:
apply a hash function to each fingerprint of the fingerprint subset, wherein a result of the application of the hash function to each fingerprint of the fingerprint subset provides an index into the fingerprint cache; and
wherein the comparison each fingerprint of the fingerprint subset to prior fingerprints stored in a fingerprint cache consists of comparing each fingerprint of the fingerprint subset to a prior fingerprint stored in the fingerprint cache at a location indexed by the hash result corresponding to the respective fingerprint of the fingerprint subset, and
wherein the determination that a one fingerprint of the fingerprint subset matches a one of the prior fingerprints consists of determining that a one fingerprint of the fingerprint subset matches the prior fingerprint stored in the fingerprint cache at the location indexed by the hash result corresponding to the one fingerprint of the fingerprint subset.

15. The apparatus according to claim 14, wherein each of the prior fingerprints stored in the fingerprint cache includes an index into the byte cache that points to a location that stores the respective sequence of data bytes of the one or more previously received data blocks of the streaming sequence of data blocks.

16. The apparatus according to claim 11, wherein the selection of the fingerprint subset is independent of a position within the one data block of the sliding fingerprint window.

17. The apparatus according to claim 11, wherein the long-range compression processor is further configured to:
leave, as literal segments, additional data bytes of the one data block regarding which matches to data bytes of the one or more previously received data blocks were not determined.

18. The apparatus according to claim 17, further comprising:
a short-range data compression processor configured to receive the match descriptor and the literal segments of the one data block, and to perform a short-range compression of the literal segments based on a short-range of the one or more previously received data blocks.

19. The apparatus according to claim 18, wherein the short-range compression comprises a compact and structured form of dictionary based compression, where the process looks for patterns in the literal segments based on assumptions that certain phrases occur more often than others.

20. The apparatus according to claim 19, wherein the short-range compression comprises a grammar-based compression process.

* * * * *